(12) United States Patent
Weipert (10) Patent No.: US 12,243,730 B2
(45) Date of Patent: Mar. 4, 2025

(54) SLIT DIAPHRAGM

(71) Applicant: SINGULUS TECHNOLOGIES AG, Kahl am Main (DE)

(72) Inventor: Peter Weipert, Schöllkrippen (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 55 days.

(21) Appl. No.: 18/020,017

(22) PCT Filed: Jun. 25, 2021

(86) PCT No.: PCT/EP2021/067511
§ 371 (c)(1),
(2) Date: Feb. 6, 2023

(87) PCT Pub. No.: WO2022/033757
PCT Pub. Date: Feb. 17, 2022

(65) Prior Publication Data
US 2023/0274922 A1    Aug. 31, 2023

(30) Foreign Application Priority Data
Aug. 13, 2020   (DE) .................. 10 2020 004 935.4

(51) Int. Cl.
*H01J 37/34* (2006.01)
*C23C 14/34* (2006.01)

(52) U.S. Cl.
CPC ...... *H01J 37/3447* (2013.01); *C23C 14/3407* (2013.01); *H01J 2237/0455* (2013.01); *H01J 2237/0458* (2013.01)

(58) Field of Classification Search
None
See application file for complete search history.

(56) References Cited

U.S. PATENT DOCUMENTS

| | | | |
|---|---|---|---|
| 2,964,998 | A | 12/1960 | Middlestadt |
| 5,584,973 | A | 12/1996 | Wada et al. |
| 2001/0005409 | A1 | 6/2001 | Gohno et al. |
| 2011/0038466 | A1 | 2/2011 | Junjie et al. |
| 2011/0089334 | A1* | 4/2011 | McRay ............ H01J 37/09 250/398 |
| 2013/0299345 | A1 | 11/2013 | Abarra et al. |
| 2014/0079179 | A1 | 3/2014 | Takagaki et al. |

(Continued)

FOREIGN PATENT DOCUMENTS

| | | |
|---|---|---|
| DE | 102004005390 A1 | 8/2005 |
| DE | 102016116568 A1 | 3/2018 |

(Continued)

OTHER PUBLICATIONS

International Preliminary Report on Patentability Chapter II for PCT Application No. PCT/EP2021/067511 completed Feb. 7, 2023 (English Translation and Original).

(Continued)

*Primary Examiner* — Jason Berman
(74) *Attorney, Agent, or Firm* — Branch Partners PLLC; Bruce E. Black (57) ABSTRACT

The present invention relates to a slit diaphragm, a slit diaphragm system comprising at least two slit diaphragms arranged adjacent to each other and to a coating module and coating facility comprising a slit diaphragm.

15 Claims, 5 Drawing Sheets

(56) References Cited

U.S. PATENT DOCUMENTS

2019/0341237 A1* 11/2019 Ohba ................. H01J 37/3447
2020/0224306 A1 7/2020 Ocker et al.

FOREIGN PATENT DOCUMENTS

| EP | 3556902 A1 | | 10/2019 | | |
|----|---|---|---|---|---|
| EP | 3587619 A1 | | 1/2020 | | |
| JP | 59107078 A | * | 6/1984 | ............ | C23C 14/22 |
| JP | S59107078 A | | 6/1984 | | |
| JP | H03202466 A | | 9/1991 | | |
| JP | H0576523 A | | 3/1993 | | |
| JP | 07335553 A | * | 12/1995 | ............ | C23C 14/34 |
| WO | WO2016128581 A1 | | 8/2016 | | |

OTHER PUBLICATIONS

International Search Report and Written Opinion for PCT Application No. PCT/EP2021/067511 mailed Oct. 8, 2021 (English Translation and Original).

* cited by examiner

Fig. 7

SLIT DIAPHRAGM

CROSS-REFERENCE TO RELATED APPLICATIONS

This present application is a U.S. national stage application of PCT Application No. PCT/EP2021/067511, filed Jun. 25, 2021, which claims priority to German Patent Application No. 10 2020 004 935.4, filed Aug. 13, 2020, both of which are hereby incorporated by reference in their entirety.

The present invention relates to a slit diaphragm, a slit diaphragm system comprising at least two slit diaphragms arranged adjacent to each other and to a coating module and coating facility comprising a slit diaphragm.

Slit diaphragms are used in various technical fields and are employed, for example, in the area of coating facilities. For example, in the case of physical deposition of layer systems using different sputter cathodes and targets, the respective non-active targets are protected against contamination by means of closed diaphragms. In this case, the slit diaphragms used serve as shutters. However, slit diaphragms are also used with variable diaphragm slits, for example in order to be able to selectively influence layer thickness profiles (cf., for example, EP 3 663 431 A1).

Various diaphragm systems for use in sputtering facilities are known, for example, from JP H03-202 466 A, US 2013/299345 A1, DE 10 2016 116 568 A1, EP 3 556 902 A1 and EP 3 587 619 A1. However, these slit diaphragms exhibit various disadvantages. For example, rack-and-pinion drives and actuators are relatively expensive and the former often have mechanical problems. For example, they can easily jam or tilt. The arrangement described in EP 3 556 902 A1, on the other hand, requires a relatively large amount of space. Because of the operation in a vacuum, membrane bellows are often required, which are, however, prone to faults and therefore require a lot of maintenance. Furthermore, membrane bellows have a limited service life and last only a limited number of load cycles. Many of the relatively complex solutions include a number of wear parts, which can have a detrimental effect on operational reliability, in particular with respect to vacuum tightness.

It is therefore an object of the present invention to provide an improved slit diaphragm, in particular for use in coating facilities, which takes account of the aforementioned disadvantages. This object is achieved with a slit diaphragm described below and a slit diaphragm system according to claims 1 and 2. Preferred embodiments of the present invention are described in the dependent claims.

Accordingly, the present invention is directed to a slit diaphragm comprising two movably mounted elongate diaphragm elements each having first and second longitudinal ends. An elongate diaphragm slit of variable width is configured between the elongate diaphragm elements. The two first longitudinal ends of the elongate diaphragm elements are connected to a rotary drive unit and the two second longitudinal ends of the elongate diaphragm elements are coupled to each other.

According to a further aspect of the present invention, a slit diaphragm comprising two movably mounted elongate diaphragm elements each having first and second longitudinal ends is claimed, wherein an elongate diaphragm slit of variable width is configured between the elongate diaphragm elements. The two elongate diaphragm elements are rotationally mounted and can be moved by a drive unit such that the longitudinal orientation of the elongate diaphragm slit remains constant for different diaphragm slit widths.

In other words, the present invention is based, inter alia, on the idea of replacing the linear drive of known slit diaphragms, which is problematic in many respects, by a rotary bearing of the diaphragm elements and/or by a rotary drive unit. The fact that the two first longitudinal ends of the diaphragm elements are connected to the rotary drive unit and the two second longitudinal ends are coupled to each other entails that the slit diaphragm can be opened and closed with a single drive unit. Furthermore, the coupling ensures that the longitudinal orientation of the elongate diaphragm slit remains constant for different diaphragm slit widths, which is particularly important if the slit diaphragm is not only used as a shutter but, for example, if a coating facility is to operate at different slit widths.

The rotary drive unit according to the invention as well as the rotary bearing of the diaphragm elements can be implemented with simple means and in a cost-efficient way. The transition to vacuum can be achieved by means of a simple rotary feedthrough, so that the problematic membrane bellows including the mechanics for a linear movement can be dispensed with. Finally, the slit diaphragm according to the invention is extremely space-saving, which will be explained in detail below.

According to the invention, an elongate diaphragm element is understood to be a diaphragm element in which the ratio of length to width is at least 4, preferably at least 6 and particularly preferably at least 8. The ratio can also be at least 10 or at least 12. The same applies to the understanding of an elongate diaphragm slit according to the invention, wherein in this case the dimensions at the maximum slit width are decisive.

According to the invention, the first and second longitudinal ends of the elongate diaphragm elements are considered to be not only the exact ends, but respective areas located at opposite ends of the diaphragm elements. The length of each of the respective longitudinal ends can be up to 20% of the length of the diaphragm elements.

According to the invention, the coupling between the two second longitudinal ends of the elongate diaphragm elements can permit relative movement of the two second longitudinal ends with respect to each other, in order to be thus able to vary the width of the elongate diaphragm slit. Particularly preferably, the two second longitudinal ends are coupled to each other via a rotary bearing.

Preferably, the two elongate diaphragm elements can be moved by a single drive unit such that the longitudinal orientation of the elongate diaphragm slit remains constant for different diaphragm slit widths. The longitudinal orientation of the elongate diaphragm slit can be defined, for example, by the orientation of the central axis of the elongate diaphragm slit. It is further preferred that the width of the diaphragm slit is substantially constant along the length of the diaphragm slit.

Preferably, the different diaphragm slit widths are achieved in that all longitudinal ends of the diaphragm elements move along circular paths. Preferably, these circular paths all have the same radius, which results in that the elongate diaphragm elements remain parallel to each other and parallel to a constant longitudinal axis of the slit for different diaphragm slit widths.

For this purpose, the first longitudinal ends of the two diaphragm elements are attached to a first rotationally mounted element, preferably in a way to be detachable without tools, and the second longitudinal ends of the two diaphragm elements are attached to a second rotationally mounted element, preferably in a way to be detachable without tools. The first element can preferably be rotated by a drive unit around an axis extending perpendicular to the longitudinal orientation of the elongate diaphragm slit. The second element can preferably rotate around an axis parallel thereto without being connected to a drive unit. Rather, the rotation of the second element is imparted by the relative movement of the two diaphragm elements with respect to each other when being driven.

The first and second elements can be first and second arms, wherein each of the first arm and the second arm is rotationally mounted centrally and/or wherein the first and second longitudinal ends of the two diaphragm elements are mounted at opposite ends of the first and second arms, respectively. Instead of such arms, however, circular discs or other rotationally mounted elements can also be used. In order to be able to achieve a variability in the diaphragm slit width as great as possible with a rotary movement as small as possible, it is preferred to attach both elongate diaphragm elements at the same distance from the axis of rotation of the rotationally mounted elements.

Preferably, the elongate diaphragm slit of variable width can be transferred from a completely closed state to a completely opened state by means of the drive unit. In the completely closed state, the two diaphragm elements preferably overlap each other. This overlap is preferably at least 1 mm, more preferably at least 3 mm and particularly preferably at least 5 mm. In the completely opened state, the two diaphragm elements preferably have a distance of at least 5 cm, more preferably at least 8 cm and particularly preferably at least 10 cm from each other. According to the invention, the distance of the two diaphragm elements from each other is defined as the distance of the two edges facing each other from each other, so that the distance of the two diaphragm elements corresponds to the slit width of the elongate diaphragm slit. Preferably, the two diaphragm elements can assume a plurality of, preferably stepless, intermediate states between the completely closed state and the completely opened state.

The two diaphragm elements preferably have a length of at least 50 cm, more preferably at least 75 cm and particularly preferably at least 100 cm.

The invention is further directed to a slit diaphragm system comprising at least two slit diaphragms as described above, which are arranged adjacent to each other. The two slit diaphragms arranged adjacent to each other are arranged and configured such that a diaphragm element of a first slit diaphragm in its completely opened state covers an area which is at least partially also covered by a diaphragm element of a second slit diaphragm in its completely opened state. The width of the area covered by both diaphragm elements is preferably at least 75%, more preferably at least 85% and particularly preferably at least 95% of the width of one diaphragm element.

Furthermore, the present invention is directed to a slit diaphragm system comprising at least two slit diaphragms as described above, which are arranged adjacent to each other, wherein the two slit diaphragms arranged adjacent to each other are arranged and configured such that a diaphragm element of a first slit diaphragm in its completely opened state is substantially directly adjacent to a diaphragm element of a second slit diaphragm in its completely closed state. The distance of the two diaphragm elements in this state is preferably at most 20%, more preferably at most 10% and particularly preferably at most 5% of the width of one diaphragm element. Preferably, the distance of the two diaphragm elements in this state is at most 5 mm, more preferably at most 3 mm and particularly preferably at most 1 mm.

In other words, the solution of the rotary bearing or the rotary drive according to the invention allows an extremely space-saving arrangement. This plays a role in particular when two or more slit diaphragms are arranged adjacent to each other, as is necessary, for example, when a multilayer system is to be deposited by means of different sputter cathodes and different targets. Since two adjacent diaphragms are never completely opened at the same time in such an installation, adjacent slit diaphragms can be mounted directly adjacent to each other here. This would not be possible, or only at great expense and in a complex way, with conventional slit diaphragms using, for example, a rack-and-pinion drive and the membrane bellows discussed at the beginning for the vacuum feedthrough.

Furthermore, the present invention is directed to a coating module comprising a slit diaphragm as described above. The coating module comprises a sputtering cathode, a target, a support device and/or transport device for a substrate, and a slit diaphragm as described above which is arranged between the target and the support device and/or transport device. The support device and/or transport device may be, for example, a substrate carrier, a susceptor plate, a conveyor belt for substrates, or the like. What is decisive for the invention in this connection is only that during coating the substrate is in a position which ensures that the slit diaphragm is arranged between the substrate and the target.

Furthermore, the present invention is directed to a coating facility comprising a slit diaphragm as described above or comprising a slit diaphragm system as described above. Preferably, the coating facility comprises a sputter cathode and a target, wherein the diaphragm slit width in the completely opened state is preferably at least 100%, more preferably at least 110%, and particularly preferably at least 120% of the width of the target. It is further preferred that the diaphragm slit width can be variably adjusted between 0% and at least 100%, more preferably at least 110% and particularly preferably at least 120% of the width of the target.

Preferably, the bearing of the longitudinal ends of the diaphragm elements and the drive unit are arranged beyond the coating area of the coating facility, viewed in the longitudinal direction. This is also advantageous, inter alia, because the bearing and the drive unit cannot become contaminated with coating material, so that the installation is less susceptible to maintenance.

As should have become clear from the above explanations, the slit diaphragm according to the invention enables a number of advantages. For example, an expensive rack-and-pinion drive can be dispensed with and a pair of diaphragm elements can be operated with only a single drive unit. The problem of jamming known from prior art linear guides cannot occur in the case of the rotary bearing, and the expensive and failure-prone membrane bellows are no longer required. The slit diaphragm according to the invention can be implemented with simple means and in a cost-efficient way, is insusceptible to maintenance and extremely space-saving.

In the following, preferred embodiments of the present invention will be described in more detail with reference to the Figures, in which.

Figure 1:
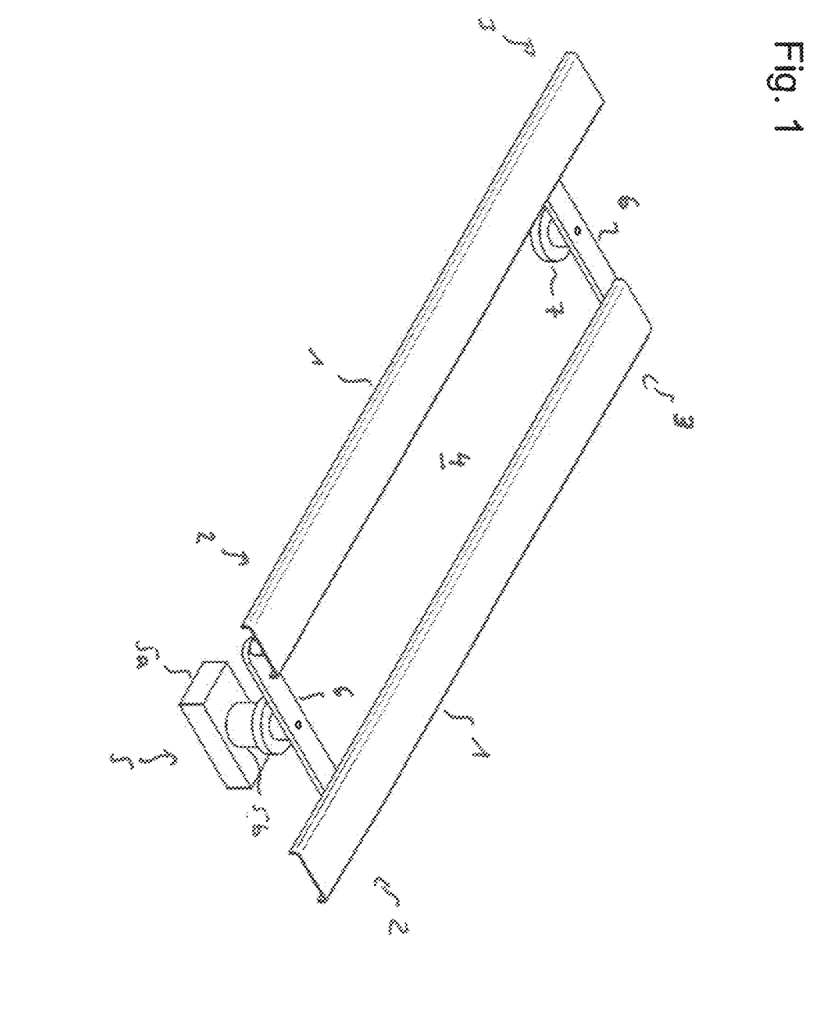
FIG. 1 shows a perspective view of a slit diaphragm according to a preferred embodiment.
Figure 2:
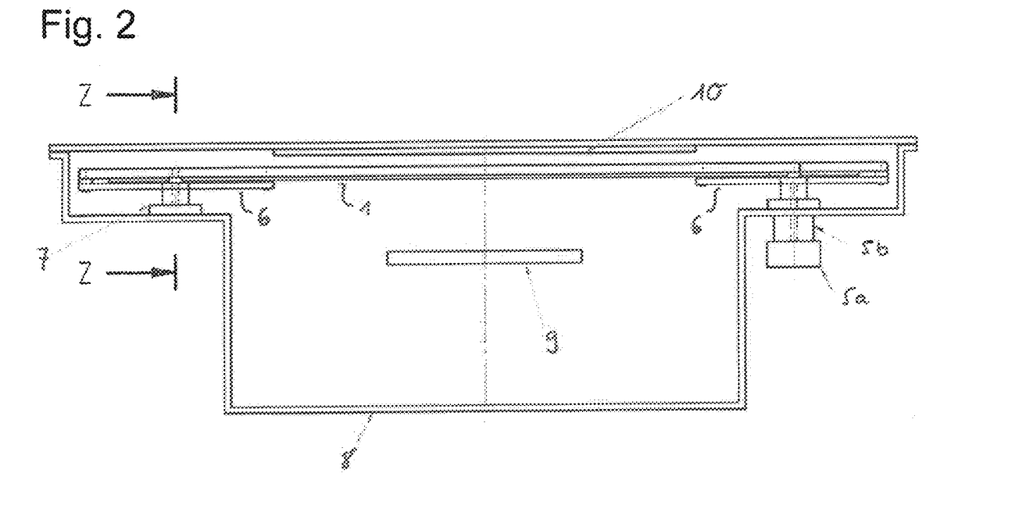
FIG. 2 shows a sectional view through a coating facility comprising a slit diaphragm according to FIG. 1.

FIG. 1 shows a schematic view of a slit diaphragm according to the invention in accordance with a preferred embodiment comprising two movably mounted elongate diaphragm elements 1, each comprising first longitudinal ends 2 and second longitudinal ends 3, wherein an elongate diaphragm slit 4 of variable width is configured between the elongate diaphragm elements 1. The two longitudinal ends 2 of the two elongate diaphragm elements 1 are connected to a rotary drive unit 5, and the two second longitudinal ends 3 of the elongate diaphragm elements 1 are coupled to each other via a rotatably mounted arm 6. The rotary drive unit 5 comprises a drive 5a and a rotary transmission leadthrough 5b for carrying out the drive movement into the vacuum area. This can be seen particularly well in the schematic sectional view through a coating facility according to FIG. 2. As can be seen in FIG. 2, the substrate 9, the target 10 and the non-illustrated sputter cathode of the coating facility are located together with the slit diaphragm in a vacuum-tight area or vessel 8. The drive 5a of the rotary drive unit 5 is located outside the vessel 8 and the torque provided by the drive 5a for rotating the arm 6 is introduced into the vacuum area of the vessel 8 by means of the rotary transmission feedthrough 5b. These rotary transmission feedthroughs are commercially available rotary transmission feedthroughs, which are simple and cost-efficient in terms of manufacture and maintenance.

At the opposite second ends 3 of the elongate diaphragm elements 1, the elongate diaphragm elements are coupled via an arm 6 to a rotary end support 7, which, however, does not require a leadthrough from the vacuum area to the outer area (cf. FIG. 2).

Figure 4:
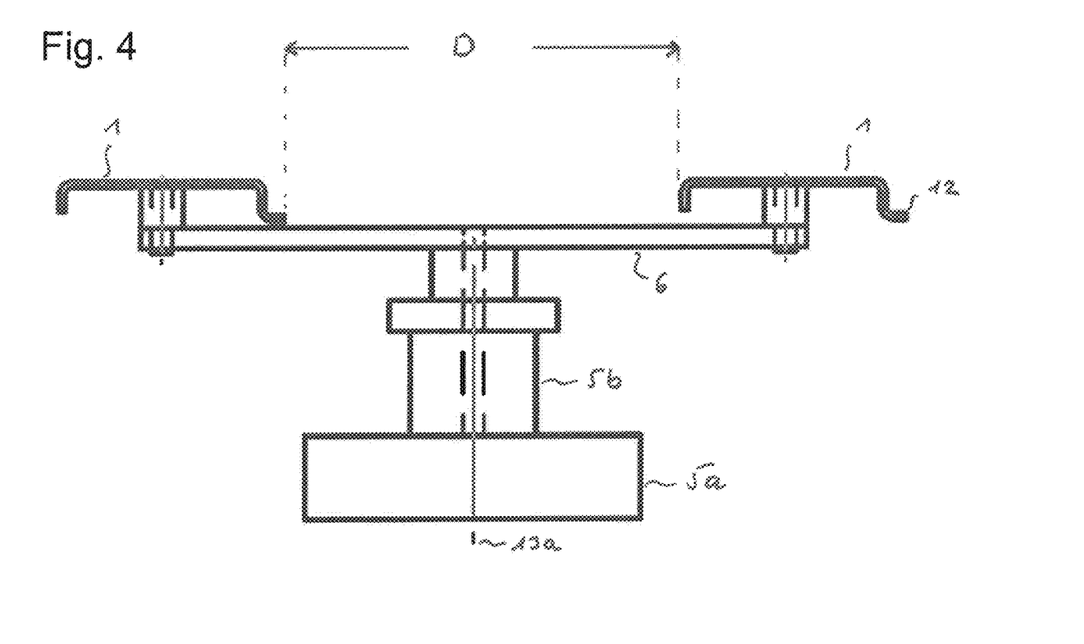
FIG. 4 shows a top view of the slit diaphragm according to FIG. 1.

In the coating facility shown in FIG. 2, the slit diaphragm according to the invention is located between the substrate 9 and the target 10 (although the arrangement could also be reverse). During the coating step, the substrate 9 can be arranged on a support device and/or transport device not shown, for example on a carrier or on a susceptor plate. In the completely opened state of the slit diaphragm, as shown in FIG. 1, the substrate 9 can be coated with material from the target 10 through the elongate diaphragm slit 4, wherein the target 10 has a length L and a width W (cf. FIG. 5). However, when the slit diaphragm is closed by rotating the arm 6 connected to the drive unit 5, the substrate 9 is protected from particles emitted from the target 10. In this sense, the slit diaphragm can be operated as a simple shutter. Additionally or alternatively, the two diaphragm elements 1 can also assume a plurality of, preferably stepless, intermediate states between the completely closed state and the completely opened state, thus acting as an aperture diaphragm whose slit width can be varied with respect to the specific coating requirements. The width of the elongate diaphragm slit 4 is defined by the distance D between the opposing side edges of the two elongate diaphragm elements 1, as indicated in FIG. 4.

Figure 6:
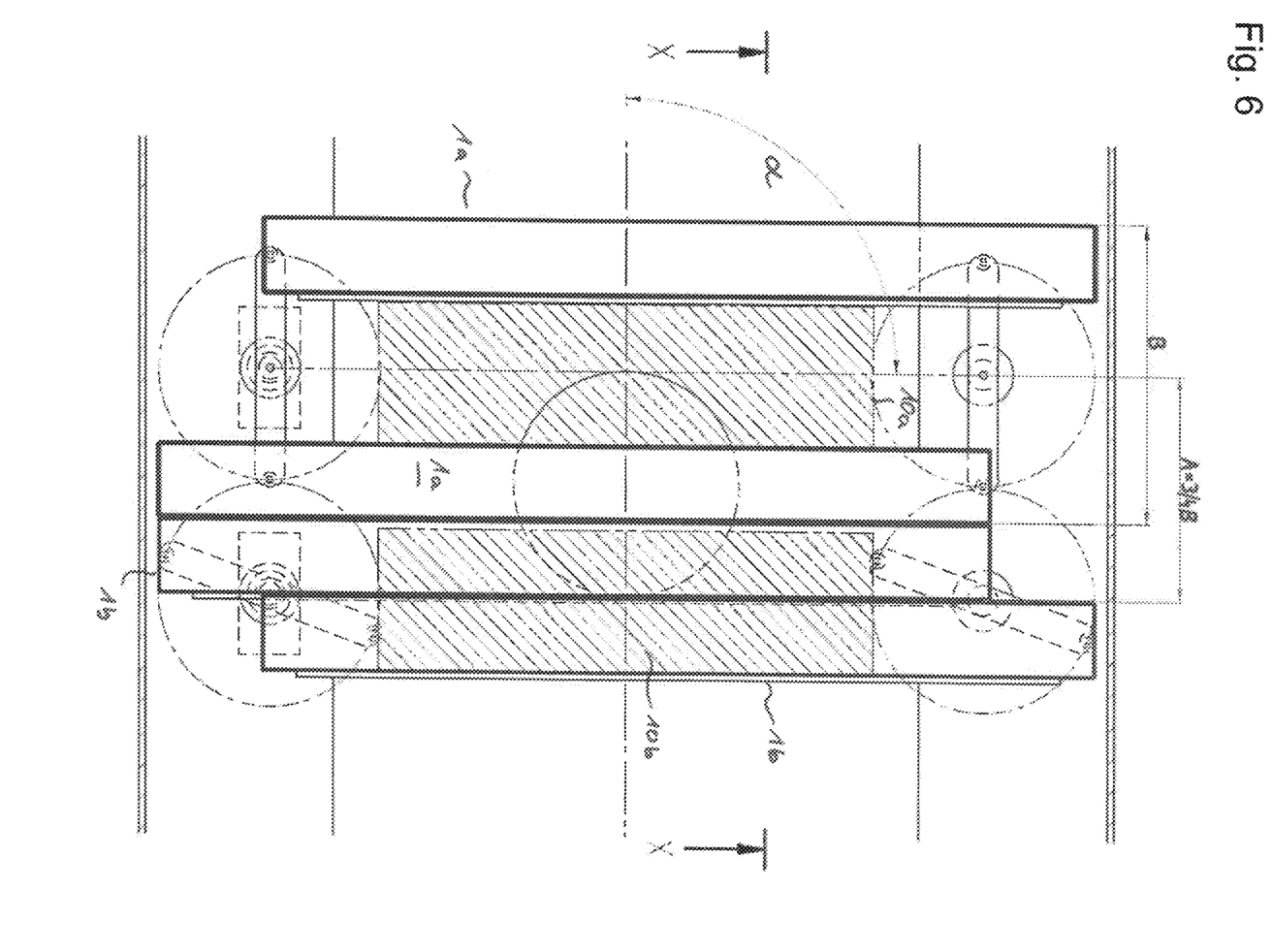
FIG. 6 shows a view from the top onto an alternative coating facility comprising two slit diaphragms according to a preferred embodiment.
Figure 7:
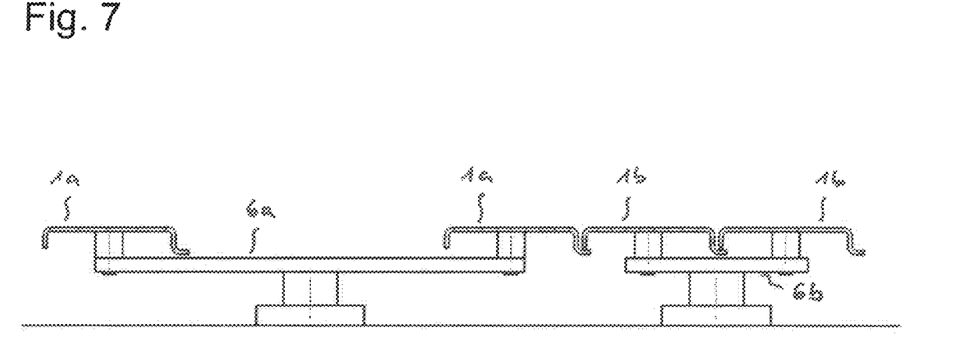
FIG. 7 shows a sectional view along X-X according to FIG. 6.

The diaphragm elements 1 preferably comprise a step or a curved section 12 on at least one side edge (cf. FIGS. 3 and 4), which is intended to ensure that the two diaphragm elements 1 overlap each other in the completely closed state, as can be seen in FIG. 7. Each of the two arms 6 is rotationally mounted centrally, and the first and second longitudinal ends of the diaphragm elements are respectively attached to opposite ends of the first and second arms (cf. FIG. 4). The first arm 6 at the first longitudinal ends 2 of the elongate diaphragm elements 1 is rotated by the drive unit 5 around a first axis 13a (cf. FIG. 4), whereas the second arm 6 at the second longitudinal ends 3 of the elongate diaphragm elements 1 is freely movable around a second axis of rotation 13b (cf. FIG. 5). When the first arm 6 is rotated by the drive unit 5, a parallel rotation of the second arm 6 is caused by traction and thrust in the two diaphragm elements 1 (cf. FIG. 5), so that all longitudinal ends of the diaphragm elements 1 move along circular paths 14 indicated in FIG. 5. The longitudinal orientation of the elongate diaphragm slit remains constant regardless of the degree of opening of the diaphragm, i.e., the angle α (cf. FIG. 6) between the longitudinal or central axis of the diaphragm slit and the width direction of the target 10 is always 900 in this embodiment. Of course, the orientation of the diaphragm slit relative to the target can also assume any other, but constant angle.

This rotational movement also entails the offset between the two diaphragm elements 1 (cf. FIGS. 1 and 5), which is intended to ensure that the length of the diaphragm elements 1 is utilized as completely as possible, since opening or closing the diaphragm simultaneously causes a relative movement of the diaphragm elements along the longitudinal extension of the slit due to the rotational bearing. This is apparent from FIG. 6, according to which the offset from the completely opened state (left) turns into its opposite during the transition to the completely closed state (right).

Figure 5:
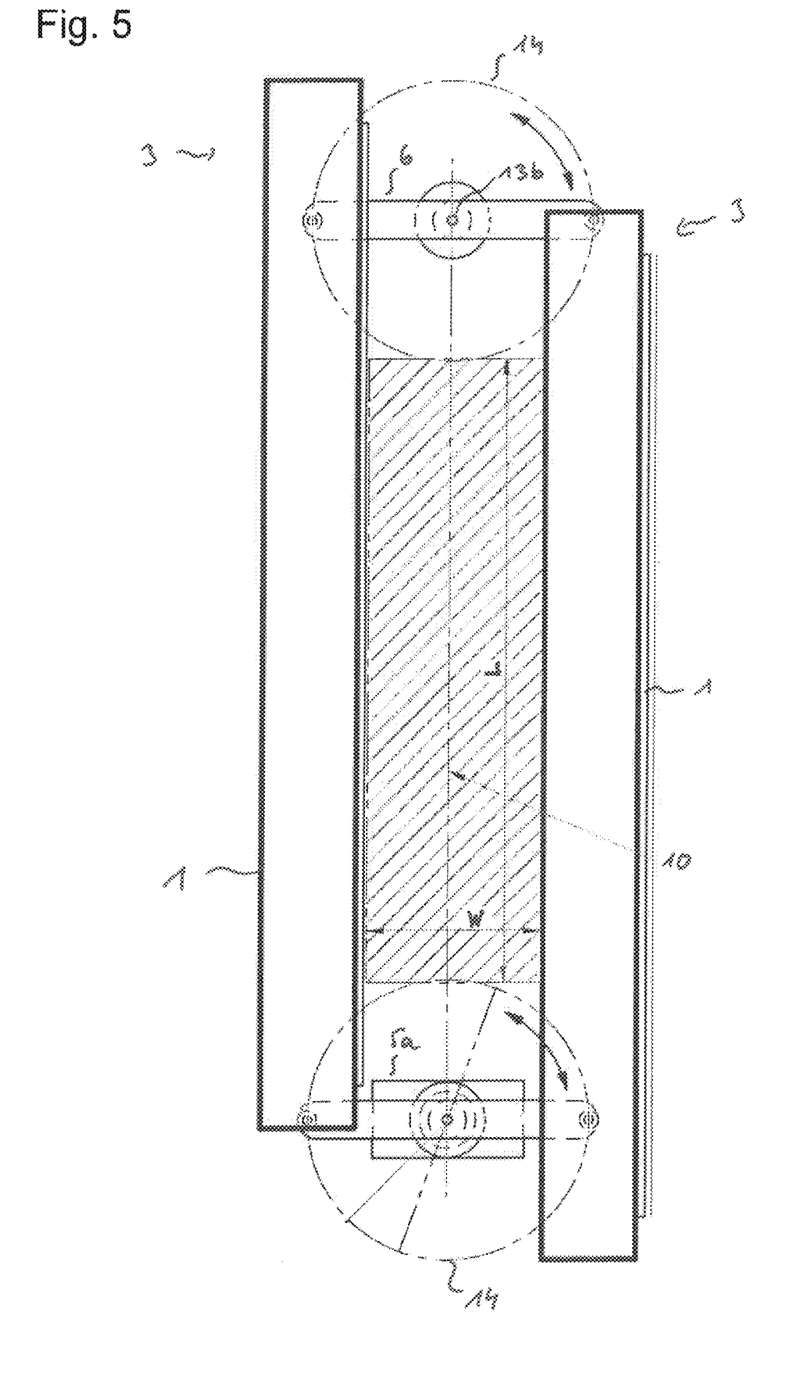
FIG. 5 shows a view from the top onto the coating facility according to FIG. 2.

Accordingly, the terms "first longitudinal end" and "second longitudinal end" are to be interpreted broadly in that also a situation as shown in FIGS. 1 and 5 is to be understood such that the two first longitudinal ends 2 are connected to a rotary drive unit 5.

Figure 3:
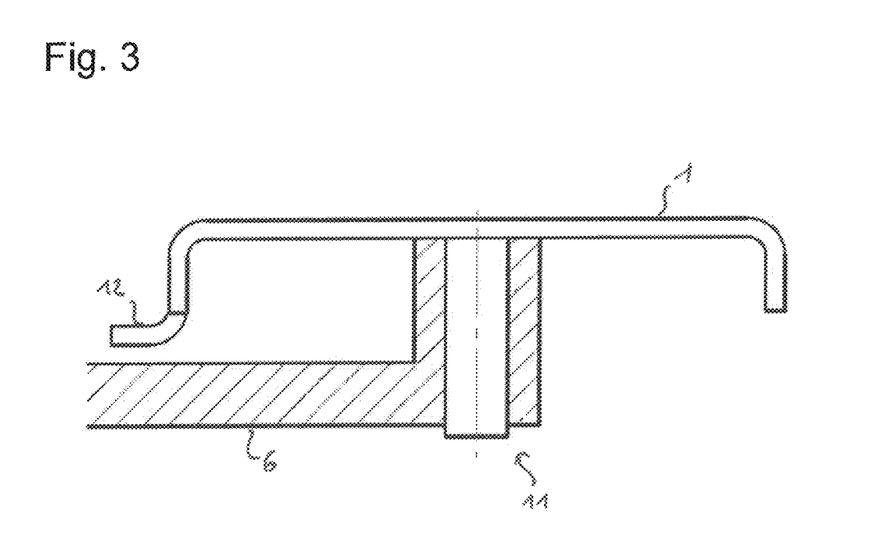
FIG. 3 shows a sectional view along Z-Z according to FIG. 2.

The two diaphragm elements 1 can be attached to the rotationally mounted arm 6 in a way to be detachable without tools, for example by means of simple plug-in connections, as indicated in FIG. 3. This facilitates, inter alia, the cleaning and maintenance of a corresponding coating facility, since the diaphragm elements can be easily removed and reattached by hand.

The present invention is also directed to a slit diaphragm system comprising at least two, preferably at least three, more preferably at least four, slit diaphragms arranged adjacent to each another, as is schematically indicated in FIGS. 6 and 7. As has already been explained, the advantage of the particularly space-saving arrangement of the slit diaphragm according to the invention is particularly apparent here.

FIG. 6 shows a slit diaphragm system comprising two slit diaphragms which are arranged adjacent to each other and in which the right diaphragm element 1a of the left slit diaphragm in its completely opened state (corresponding to FIG. 6) is substantially directly adjacent to the left diaphragm element 1b of the right slit diaphragm in its completely closed state. In this state, the left slit diaphragm is completely opened so that the left target 10a is completely exposed, whereas the right target 10b is completely covered by the completely closed right slit diaphragm.

When the two drive units are now each rotated by just under 900, the left slit diaphragm is completely closed and the right slit diaphragm is completely opened. Also in this state, the right diaphragm element 1a of the left slit diaphragm and the left diaphragm element 1b of the right slit diaphragm will then be essentially directly adjacent to each other. The area covered by the right diaphragm element 1a of the left slit diaphragm in the state shown in FIG. 6 will then be covered by the left diaphragm element 1b of the right slit diaphragm.

If B describes the maximum extension of a slit diaphragm in the width direction, the arrangement according to the invention can accommodate two slit diaphragms on a width extension of 1.75 B. In other words, the distance between the coating areas, i.e. the distance between the center axes of the coating areas or between the center axes of the sputtering cathodes, is then A=0.75 B (cf. FIG. 6). The effective width of a diaphragm system comprising two slit diaphragms is thus reduced from 2 B in the case of conventional systems to 1.75 B in the case of systems according to the invention. For a diaphragm system comprising n slit diaphragms, the effective width is (0.75×n+0.25) B.

The invention claimed is:

1. A slit diaphragm system comprising at least two slit diaphragms arranged adjacent to each other, wherein each slit diaphragm comprises two movably mounted elongate diaphragm elements each having first and second longitudinal ends, wherein an elongate diaphragm slit of variable width is configured between the two elongate diaphragm elements, wherein the two first longitudinal ends are connected to a rotary drive unit and wherein the two second longitudinal ends are coupled to each other; wherein the at least two slit diaphragms arranged adjacent to each other are arranged and configured such that a diaphragm element of a first slit diaphragm in its completely opened state covers an area which is at least partially also covered by a diaphragm element of a second slit diaphragm in its completely opened state.

2. The slit diaphragm system according to claim 1, wherein, for at least one slit diaphragm of the at least two slit diaphragms, the two elongate diaphragm elements of that slit diaphragm can be moved by a single drive unit such that the longitudinal orientation of the elongate diaphragm slit remains constant for different diaphragm slit widths.

3. The slit diaphragm system according to claim 1, wherein, for at least one slit diaphragm of the at least two slit diaphragms, the first longitudinal ends of the two diaphragm elements of that slit diaphragm are attached to a first rotationally mounted arm and wherein the second longitudinal ends of the two elongate diaphragm elements of that slit diaphragm are attached to a second rotationally mounted arm, and wherein each of the first arm and the second arm is rotationally mounted centrally.

4. The slit diaphragm system according to claim 1, wherein the elongate diaphragm slit of variable width can be transferred from a completely closed state to a completely opened state by the rotary drive unit, wherein, for at least one slit diaphragm of the at least two slit diaphragms, the two elongate diaphragm elements of that slit diaphragm can assume a plurality of intermediate states between the completely closed state and the completely opened state.

5. The slit diaphragm system according to claim 4, wherein, for at least one slit diaphragm of the at least two slit diaphragms, in the completely closed state, the two elongate diaphragm elements of that slit diaphragm overlap each other by at least 1 mm and wherein, in the completely opened state, the two elongate diaphragm elements of that slit diaphragm have a distance of at least 5 cm.

6. The slit diaphragm system according to claim 1, wherein the at least two slit diaphragms comprise a first slit diaphragm and a second slit diaphragm that are arranged adjacent to each other and are arranged and configured such that a one of the two elongate diaphragm elements of the first slit diaphragm in its completely opened state is substantially directly adjacent to a one of the two elongate diaphragm elements of the second slit diaphragm in its completely closed state.

7. A coating module comprising a sputtering cathode, a target, a support device and/or transport device for a substrate, and a slit diaphragm which is arranged between the target and the support device and/or transport device and comprises two movably mounted elongate diaphragm elements each having first and second longitudinal ends, wherein an elongate diaphragm slit of variable width is configured between the two elongate diaphragm elements, wherein the two elongate diaphragm elements are rotationally mounted and can be moved by a drive unit such that the longitudinal orientation of the elongate diaphragm slit remains constant for different diaphragm slit widths, wherein the elongate diaphragm slit of variable width can be transferred from a completely closed state to a completely opened state by the drive unit, wherein, in the completely closed state, the two elongate diaphragm elements overlap each other and wherein, in the completely opened state, the two elongate diaphragm elements have a distance of at least 5 cm.

8. The coating module according to claim 7, wherein the two elongate diaphragm elements can be moved by the drive unit such that the longitudinal orientation of the elongate diaphragm slit remains constant for different diaphragm slit widths.

9. The coating module according to claim 7, wherein different diaphragm slit widths are achieved in that all of the first and second longitudinal ends of the two elongate diaphragm elements move along circular paths.

10. The coating module according to 7, wherein the first longitudinal ends of the two elongate diaphragm elements are attached to a first rotationally mounted element and wherein the second longitudinal ends of the two elongate diaphragm elements are attached to a second rotationally mounted element.

11. The coating module according to claim 10, wherein the drive unit is configured to rotate the first rotationally mounted element around an axis extending perpendicular to the longitudinal orientation of the elongate diaphragm slit.

12. The coating module according to claim 10, wherein the first and second rotationally mounted elements are first and second arms, and wherein each of the first arm and the second arm is rotationally mounted centrally and wherein the two elongate diaphragm elements can assume a plurality of intermediate states between the completely closed state and the completely opened state.

13. A coating facility comprising the slit diaphragm system according to claim 1.

14. The coating facility according to claim 13, wherein the coating facility comprises a sputtering cathode and a target, wherein at least one of: a) the width of the elongate diaphragm slit in the completely opened state is at least 100% of the width of the target or b) the width of the elongate diaphragm slit can be variably adjusted between 0% and at least 100% of the width of the target.

15. The coating facility according to claim 13, wherein a bearing of the first and second longitudinal ends of the two elongate diaphragm elements is arranged beyond a coating area of the coating facility, viewed in the longitudinal direction.

* * * * *